US008686441B2

United States Patent
Ogawa et al.

(10) Patent No.: US 8,686,441 B2
(45) Date of Patent: Apr. 1, 2014

(54) LIFE-IMPROVED SEMICONDUCTOR LIGHT EMITTING DEVICE

(75) Inventors: Toshiaki Ogawa, Anan (JP); Hisashi Kasai, Anan (JP); Masahiko Sano, Anan (JP)

(73) Assignee: Nichia Corporation, Anan-shi (JP)

( * ) Notice: Subject to any disclaimer, the term of this patent is extended or adjusted under 35 U.S.C. 154(b) by 0 days.

(21) Appl. No.: 13/441,679

(22) Filed: Apr. 6, 2012

(65) Prior Publication Data

US 2012/0256221 A1    Oct. 11, 2012

(30) Foreign Application Priority Data

Apr. 8, 2011   (JP) ................................. 2011-086821
Feb. 8, 2012   (JP) ................................. 2012-025525

(51) Int. Cl.
H01L 27/15   (2006.01)
H01L 33/42   (2010.01)
H01L 33/40   (2010.01)
H01L 33/46   (2010.01)

(52) U.S. Cl.
CPC ............... *H01L 27/15* (2013.01); *H01L 33/42* (2013.01); *H01L 33/405* (2013.01); *H01L 33/46* (2013.01)
USPC .. 257/79; 257/98; 257/E33.064; 257/E33.072

(58) Field of Classification Search
CPC ........ H01L 33/46; H01L 33/42; H01L 33/405
USPC ............... 257/79, 98, 184, E33.064, E33.072
See application file for complete search history.

(56) References Cited

U.S. PATENT DOCUMENTS

| 7,157,371 | B2 * | 1/2007 | Hecht et al. .................. 438/653 |
| 2005/0017262 | A1 * | 1/2005 | Shei et al. ..................... 257/103 |
| 2005/0104080 | A1 * | 5/2005 | Ichihara et al. ................ 257/98 |
| 2006/0273335 | A1 | 12/2006 | Asahara et al. |
| 2007/0170596 | A1 * | 7/2007 | Wen et al. ..................... 257/777 |
| 2008/0241421 | A1 * | 10/2008 | Chen et al. .................... 427/576 |
| 2009/0008672 | A1 * | 1/2009 | Osawa et al. .................. 257/99 |
| 2009/0315048 | A1 | 12/2009 | Fehrer et al. |

FOREIGN PATENT DOCUMENTS

EP    2006922 A1    12/2008
JP    2009-164423 A    7/2009

(Continued)

OTHER PUBLICATIONS

Extended European Search Report, Application No. 12163208.7-1226, dated Jun. 12, 2012.

*Primary Examiner* — Julia Slutsker
(74) *Attorney, Agent, or Firm* — Foley & Lardner LLP

(57) ABSTRACT

A semiconductor light emitting device includes first and second semiconductor layers, an active region, a transparent electrically-conducting layer 13, a reflecting structure 20, and a first electrode. The second semiconductor layer has a conductivity different from the first semiconductor layer. The active region is arranged between the first and second semiconductor layers. The transparent electrically-conducting layer 13 is arranged on or above the first semiconductor layer. The reflecting structure 20 is arranged on or above the transparent electrically-conducting layer 13. The first electrode is arranged on or above the reflecting structure 20, and electrically connected to the first semiconductor layer. The reflecting structure 20 includes at least a reflective layer 16. An intermediate layer 17 is interposed between the transparent electrically-conducting layer 13 and the reflecting structure 20. The intermediate layer 17 is formed of a material containing an element with larger ionization tendency than the reflective layer 16.

13 Claims, 7 Drawing Sheets

(56) References Cited

FOREIGN PATENT DOCUMENTS

| | | |
|---|---|---|
| JP | 2009-537982 A | 10/2009 |
| WO | WO 2007/027035 | 3/2007 |
| WO | WO 2007/085218 | 8/2007 |
| WO | WO/2007/136392 A1 | 11/2007 |

* cited by examiner

LIFE-IMPROVED SEMICONDUCTOR LIGHT EMITTING DEVICE

CROSS-REFERENCE TO RELATED PATENT APPLICATIONS

This application claims priority to Japan Application Nos. 2011-086821 and 2012-025525, filed Apr. 8, 2011 and Feb. 8, 2012, the contents of which are incorporated herein by reference in their entirety.

BACKGROUND OF THE INVENTION

1. Field of the Invention

The present invention relates to a semiconductor light emitting device.

2. Description of the Related Art

Semiconductor light emitting devices can be small and highly effective in power consumption, and can emit vivid color light. In addition, in the case of light emitting devices of semiconductor devices, there are no concerns about bulb burnout and the like. In addition, semiconductor light emitting devices have features such as excellent initial driven characteristics, resistance to vibration or ON/OFF repeats. Since semiconductor light emitting devices have these excellent features, semiconductor light emitting devices such as light emitting diode (hereinafter, occasionally referred to as "LED") and laser diode (hereinafter, occasionally referred to as "LD") have been used as various types of light sources. In particular, in recent years, light emitting diodes receive attention as light source for lighting replacement of fluorescent lamps, in other words, as next-generation lighting having long life and low power consumption. From this viewpoint, further improvement is required in light output and light emission efficiency.

In order to improve outgoing efficiency of light emission, the inventors have been developed a flip-chip type light emitting device which has a reflective film with improved reflectivity, the flip-chip type light emitting device having electrode surfaces opposed to a mount surface (Laid-Open Patent Publication No. JP 2009-164,423). As shown in a cross-sectional view of FIG. 8A and an enlarged view of FIG. 8B, the light emitting device disclosed in this document includes a semiconductor structure 11 which has light-emitting layer 8, a light-outgoing surface 18 which is arranged on one of the main surfaces of the semiconductor structure 11, and electrodes 3 which are arranged on the other main surface opposed to the light-outgoing surface 18 and are electrically connected to the semiconductor structure 11. In the light emitting device, a reflecting structure 20 is formed between the semiconductor structure 11 and each of the electrodes 3. The reflecting structure 20 includes a reflective layer 16 which is formed above the semiconductor structure 11, and a dielectric multilayer film 4 which is arranged on this reflective layer 16 and is composed of a plurality of dielectric layers. The refractive index of the reflective layer 16 is smaller than the refractive index of the semiconductor structure 11. The center wavelength of the reflection spectrum of the reflecting structure 20 is longer than the light emission peak wavelength of the light-emitting layer 8. According this construction, it is possible to provide a reflecting structure which can be thin but can have excellent weatherability and high reflectivity.

See Japanese Laid-Open Patent Publication No. JP 2009-537,982 T.

As stated above, in the case of semiconductor light emitting devices, since there are no concerns about bulb burnout and the like as compared with light bulbs, in addition to this feature, further improvement is required in durability or reliability so that the semiconductor light emitting devices can be virtually maintenance-free. However, semiconductor light emitting devices have a disadvantage that the forward voltage in the operation will gradually rise as the use time of the semiconductor light emitting devices. If the forward voltage rises, the loss will be large so that the heat amount will be large. Heat dissipation is important for semiconductor light emitting devices. If the heat amount of semiconductor light emitting devices becomes large, this will affect the life of the products. Generally, if the forward voltage rises 10% or more, it is judged that failure occurs. In particular, in recent years, it is required to reduce power consumption. Also, from this viewpoint, increase of driving voltage is undesirable.

The present invention is aimed at solving the problem. It is a main object of the present invention to provide a semiconductor light emitting device which is excellent in life characteristic, and can suppress rise of forward voltage.

SUMMARY OF THE INVENTION

To achieve the above object, a semiconductor light emitting device of a first aspect of the present invention includes a first semiconductor layer, a second semiconductor layer, an active region, a transparent electrically-conducting layer 13, a reflecting structure 20, and a first electrode. The second semiconductor layer has a conductivity different from the first semiconductor layer. The active region is arranged between the first and second semiconductor layers. The transparent electrically-conducting layer 13 is arranged on or above the first semiconductor layer. The reflecting structure 20 is arranged on or above the transparent electrically-conducting layer 13. The first electrode is arranged on or above the reflecting structure 20, and is electrically connected to the first semiconductor layer. The reflecting structure 20 includes at least a reflective layer 16. An intermediate layer 17 is interposed between the transparent electrically-conducting layer 13 and the reflecting structure 20. The intermediate layer 17 is formed of a material which contains an element with larger ionization tendency than the reflective layer 16. According to this construction, since the intermediate layer is interposed between the transparent electrically-conducting layer and the reflecting structure, it can be suppressed that the forward voltage in the operation gradually rises with the use time of the semiconductor light emitting devices. Therefore, it is possible to provide advantages that reliability and durability are improved. In particular, the transparent electrically-conducting layer can be resistant to oxidation. As a result, it is possible to suppress increase of the resistance, i.e., rise of Vf.

In a semiconductor light emitting device of a second aspect of the present invention, the reflecting structure 20 can include a dielectric multilayer film 4 that is arranged on or above the reflective layer 16 and is formed of a plurality of dielectric layers, and the thickness of the dielectric multilayer film can be smaller than the reflective layer.

In a semiconductor light emitting device of a third aspect of the present invention, the reflective layer 16 can be formed of $SiO_2$.

In a semiconductor light emitting device of a fourth aspect of the present invention, the transparent electrically-conducting layer 13 can be formed of ITO.

In a semiconductor light emitting device of a fifth aspect of the present invention, the intermediate layer 17 can be formed of $Nb_2O_5$, $Al_2O_3$, or $TiO_2$. According to this construction, since the transparent electrically-conducting layer 13 is covered by the material which contains an element with larger ionization tendency than the reflective layer, the transparent electrically-conducting layer can be resistant to oxidation. As a result, it is possible to suppress increase of the resistance, i.e., rise of Vf. Therefore, it is possible to improve the life and the reliability of the device.

In a semiconductor light emitting device of a sixth aspect of the present invention, the intermediate layer 17 can have a thickness of 270 to 540 Å. According to this construction, the initial characteristic and the life characteristic can be ensured in a good balance. Also, the sheet resistance of the transparent electrically-conducting layer can be smaller.

In a semiconductor light emitting device of a seventh aspect of the present invention, the intermediate layer can be formed of the same material as any of the layers which compose the dielectric multilayer film. According to this construction, since the intermediate layer is formed of the same material as any of the layers, which are deposited on or above the intermediate layer, any additional target material is not required when the intermediate layer is deposited in the manufacturing process. Therefore, it is possible to provide an advantage that the manufacturing cost is lower.

In a semiconductor light emitting device of an eighth aspect of the present invention, the intermediate layer 17 can be formed of $Nb_2O_5$.

In a semiconductor light emitting device of a ninth aspect of the present invention, a second electrode can be provided which is electrically connected to the second semiconductor layer. The first and second electrodes can be arranged on a first main surface side of the semiconductor light emitting device. The first main surface can serve as a mount surface to be mounted, while a second main surface opposed to the first main surface can serve as a light-outgoing surface through which light outgoes. According to this construction, in a flip-chip type semiconductor light emitting device, it is possible to suppress rise of forward voltage.

In a semiconductor light emitting device of a tenth aspect of the present invention, a second electrode can be provided which is electrically connected to the second semiconductor layer. The first and second electrodes can be arranged on a first main surface side of the semiconductor light emitting device. The first main surface can serve as a light-outgoing surface through which light outgoes, while a second main surface opposed to the first main surface can serve as a mount surface to be mounted. According to this construction, in a face-up type semiconductor light emitting device, it is possible to suppress rise of forward voltage.

Also, a semiconductor light emitting device of an eleventh aspect of the present invention includes a first semiconductor layer, a second semiconductor layer, an active region, a transparent electrically-conducting layer 13, a reflecting structure 20, and a first electrode. The second semiconductor layer has a conductivity different from the first semiconductor layer. The active region is arranged between the first and second semiconductor layers. The transparent electrically-conducting layer 13 is arranged on or above the first semiconductor layer. The reflecting structure 20 is arranged on or above the transparent electrically-conducting layer 13. The first electrode is arranged on or above the reflecting structure 20, and is electrically connected to the first semiconductor layer. An intermediate layer 17 is interposed between the transparent electrically-conducting layer 13 and the reflecting structure 20. The intermediate layer 17 is formed of $Nb_2O_5$, $Al_2O_3$, $TiO_2$, or SiN.

The above and further objects of the present invention as well as the features thereof will become more apparent from the following detailed description to be made in conjunction with the accompanying drawings.

DETAILED DESCRIPTION OF THE EMBODIMENT(S)

Figure 1:
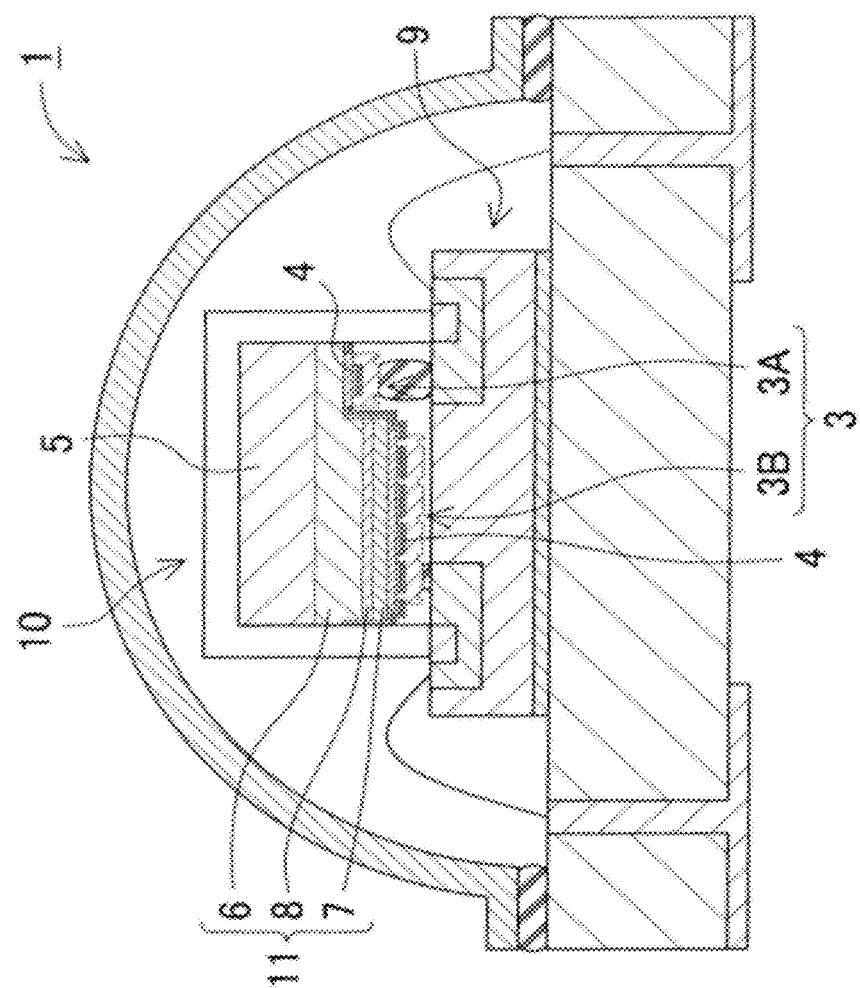
FIG. 1 is a cross-sectional view schematically showing a light emitting apparatus according to a first embodiment.

The following description will describe embodiments according to the present invention with reference to the drawings. It should be appreciated, however, that the embodiments described below are illustrations of a semiconductor light emitting device used therein to give a concrete form to technical ideas of the invention, and a semiconductor light emitting device of the invention is not specifically limited to description below. In this specification, reference numerals corresponding to components illustrated in the embodiments are added in "Claims" and "Summary" to aid understanding of claims. However, it should be appreciated that the members shown in claims attached hereto are not specifically limited to members in the embodiments. Unless otherwise specified, any dimensions, materials, shapes and relative arrangements of the parts described in the embodiments are given as an example and not as a limitation. Additionally, the sizes and the positional relationships of the members in each of drawings are occasionally shown larger exaggeratingly for ease of explanation. Members same as or similar to those of this invention are attached with the same designation and the same reference numerals, and their description is omitted. In addition, a plurality of structural elements of the present invention may be configured as a single part that serves the purpose of a plurality of elements, on the other hand, a single structural element may be configured as a plurality of parts that serve the purpose of a single element.

Also, the term "on [or above]" (e.g., on or above a layer) used in the specification is not limited to the state where a member is formed in contact with a layer but occasionally includes the state where a member is formed upward relative to a layer to be spaced away from the layer, in other words, the state where a member is formed to interpose an interposed member between the member and the layer in an inclusive sense. Also, the description of some of examples or embodiments may be applied to other examples, embodiments or the like.

First Embodiment

FIG. 1 is a cross-sectional view showing a light emitting apparatus 1 according to a first embodiment of the present invention. This illustrated light emitting apparatus 1 includes a light emitting device 10 of an LED chip, which is a sort of nitride semiconductor device. This LED chip is mounted onto a wiring board 9, which is a sort of submount, in a flip chip mounting manner. The flip chip mounting manner refers to a mounting manner where a growth substrate 5 serves as a light outgoing surface through which light outgoes. Semiconductor layers are deposited on the growth substrate side. The growth substrate is opposed to an electrode formation surface on which an electrode is formed. The flip chip mounting manner is also referred to as facedown mounting manner. The light emitting device 10 is shown upside down in FIG. 1 for illustrating the flip chip mounting manner.

FIG. 2 is a cross-sectional view schematically showing the light emitting device 10 shown in FIG. 1 before the light emitting device is mounted to the light emitting apparatus, in other words, with the growth substrate 5 facing downward and a semiconductor structure 11 being arranged upward relative to the growth substrate. In the manufacturing process of this light emitting apparatus, in practice, the nitride semiconductor device is mounted with the layers on the upper surface of the growth substrate 5 being orientated upside down as shown in FIG. 1. The following description will schematically describe the light emitting device 10 with reference to FIG. 2. Members that are configured similarly to the members of the light emitting device 10 shown in FIG. 1 are attached with the same reference numerals as the corresponding members of the light emitting device 10 shown in FIG. 2, and their description is omitted for sake of brevity.

The light emitting device 10 includes the semiconductor structure 11 including a light-emitting layer 8. In the light emitting device 10 shown in FIG. 2, nitride semiconductor layers are deposited on or above one of a pair of main surfaces of the growth substrate 5, which are opposed to each other. The nitride semiconductor layers compose the semiconductor structure 11. Specifically, the semiconductor structure 11 of the light emitting device 10 includes a first nitride semiconductor layer 6, the active layer 8, and a second nitride semiconductor layer 7, which are laminated on the upper surface side of the growth substrate 5, in this order. In addition, first and second electrodes 3A and 3B are formed and electrically connected to the first and second nitride semiconductor layers 6 and 7, respectively. When electric power is supplied to the light emitting device 10 from an external source through the first and second electrodes 3A and 3B, the active layer 8 emits light so that the light outgoes mainly through the bottom surface side of the growth substrate 5 as viewed in FIG. 2A. That is, in the case of the light emitting device 10 shown in FIG. 2A, the other (bottom side in FIG. 2A) of the main surfaces of the growth substrate 5 serves as a main light-outgoing surface 18 through which the light mainly outgoes. The other of main surfaces is opposed to a mount surface (top side in FIG. 2A) where the electrodes 3A and 3B are formed.

Each of a pair of electrodes 3, which are of the first and second electrodes 3A and 3B, includes a reflecting structure 20. For example, the reflecting structure 20 can include a dielectric multilayer film 4 having a multilayer structure. FIG. 2B is an enlarged sectional view showing a part around the dielectric multilayer film 4, which is shown by the circle in FIG. 2A. As shown in FIG. 2B, the dielectric multilayer film 4 has the multilayer structure including a plurality of dielectric layers 4a. Each of the dielectric layers 4a is composed of a set of two or more material layers 4n and 4m the refractive indices of which are different from each other. Thus, a plurality of sets of material layers 4n and 4m are laminated on one after another. The dielectric multilayer film 4 is arranged at least partially in the area between the semiconductor structure 11 and each of the electrodes 3. The dielectric multilayer film 4 is divided into parts, which are spaced away from each other in the horizontal direction. The dielectric multilayer film 4 can selectively reflect light with a desired wavelength. The specific structure of the dielectric multilayer film 4 will be described later. The center wavelength $\lambda$ of the reflection spectrum of the dielectric multilayer film (DBR) 4 according to the first embodiment is longer than the peak wavelength $\lambda_p$ of the light emitted from the light-emitting layer 8.

(Light Emitting Device)

For example, in the case where the light emitting device 10 is a nitride semiconductor device as LED shown in FIG. 2, the light emitting device includes a sapphire substrate as the growth substrate 5, the nitride semiconductor structure 11, and a transparent electrically-conducting layer 13 which is formed on or above the semiconductor structure 11. The semiconductor structure 11 includes an n-type semiconductor layer as the first nitride semiconductor layer 6, and a light-emitting layer as the active layer 8, and a p-type semiconductor layer as the second nitride semiconductor layer 7, which are epitaxially grown on or above the sapphire substrate in this order.

Subsequently, the light-emitting layer 8 and the p-type semiconductor layer 7 are selectively partially removed by etching so that the n-type semiconductor layer 6 is partially exposed. An n-type pad electrode as the first electrode 3A is formed on the partially exposed part of the n-type semiconductor layer. A p-type pad electrode as the second electrode 3B is formed on the same surface side as the n-type electrode 3A on or above the transparent electrically-conducting layer 13. In addition, only predetermined areas of the n-type and p-type pad electrode 3A and 3B are selectively exposed so that the other areas of the n-type and p-type pad electrode 3A and 3B are covered by an electrically-insulating protective film. The n-type pad electrode may be formed in the partially exposed part of the n-type semiconductor layer 6 with the transparent electrically-conducting layer 13 being interposed between the n-type pad electrode and the n-type semiconductor layer. The following description will specifically describe components of the semiconductor light emitting device 1.

(Growth Substrate)

The growth substrate 5 is a substrate on which the semiconductor structure 11 can be grown. The size, thickness, and the like of the growth substrate are not specifically limited. The substrate for nitride semiconductor can be electrically-insulating substrates (e.g., sapphire having C-facet, R-facet or A-facet as primary surface and spinel ($MgAl_2O_4$)), silicon carbide (6H, 4H, 3C), silicon, ZnS, ZnO, Si, GaAs, diamond, oxide substrates (for example, lithium niobate and neodymium gallate, which are bondable with nitride semiconductor in a lattice-matching manner), and nitride semiconductor substrates (e.g., GaN and AlN). Also, the substrate for nitride semiconductor may be off-angled nitride semiconductor substrates (for example, off-angled 0.01° to 3.0° relative to the C-facet of sapphire). In addition, the growth substrate 5 can be removed to form a substrate-less semiconductor structure after the light emitting device construction is formed on the growth substrate. Also, the thus-formed substrate-less semiconductor structure can be bonded onto a support substrate (e.g., electrically-conductive substrate) or bonded onto a support substrate in a flip-chip manner. Also, the thus-formed substrate-less semiconductor structure can be bonded onto other transparent members/transparent substrates. Specifically, in the case where the growth substrate and the bonded member/substrate are arranged on the light-outgoing main surface side of the semiconductor structure, they are required to be transparent. In this case, if the growth substrate is not transparent, or cuts off or absorbs light, it is necessarily removed. If the semiconductor structure is bonded onto the bonded component/substrate which is not transparent, or cuts off or absorbs light, the bonded component/substrate is necessarily arranged on the light reflection main surface side of the semiconductor structure. In the case where electric power is supplied to the semiconductor structure through the transparent substrate/member on the light outgoing side, the transparent substrate/member is required to be electrically conductive. In addition to this, the semiconductor structure may be bonded onto and covered by a transparent member such as glass and resin so that the semiconductor structure is supported by the transparent member. For example, the growth substrate can be removed by grinding or LLO (Laser Lift Off) with the semiconductor light emitting device being retained by a retaining device or on the chip mount part of the submount. Even in the case the growth substrate is transparent but different type from the semiconductor structure, it is preferable that the substrate is removed. The reason is the substrate removal can improve the light outgoing efficiency and the output of the light emitting device.

(Semiconductor Structure)

The semiconductor structure 11 is preferably formed of a nitride semiconductor in the case where the light emitting apparatus includes the nitride semiconductor layers and a light conversion member (phosphor etc.) used together. The nitride semiconductor can emit short-wavelength visible light, near-ultraviolet light, or light with wavelength shorter than them. The nitride semiconductor will be discussed later in an example. The semiconductor structure is not limited to this. The semiconductor structure may be formed of other semiconductors such as InGaAs group semiconductor and GaP group semiconductor.

(Light Emitting Device Construction)

The light emitting device construction of the semiconductor layers preferably has the active layer between the first electrically-conductive type (n-type) layer and the second electrically-conductive type (p-type) layer discussed later from viewpoint of output and efficiency. However, the light emitting device construction is not limited to this, and can be the construction discussed later or other types of light emitting device construction. Each electrically-conductive type layer may partially include an electrically-insulating structure, a semi-electrically-insulating structure or an opposite electrically-conductive type structure. Also, the first electrically-conductive type layer and the second electrically-conductive type layer may be additionally provided with an electrically-insulating structure, a semi-electrically-insulating structure or an opposite electrically-conductive type structure. Also, the first electrically-conductive type layer and the second electrically-conductive type layer may be additionally provided with other circuit structure such as protection structure. The aforementioned substrate may serve as a part of an electrically-conductive type layer.

The electrodes for the first electrically-conductive type (n-type) layer and the second electrically-conductive type (p-type) layer are preferably arranged on one of the main surface sides as discussed later in the example. However, the electrodes are not limited to this arrangement. The electrodes may be arranged on the both main surface sides of the semiconductor structure, and be opposed to each other. For example, one of the electrodes may be arranged on the removal side of the aforementioned substrate-removed structure.

The semiconductor layer construction can include homo junction structure, hetero junction structure, or double-hetero junction structure having MIS junction, PIN junction or PN junction. The layer can have a super-lattice structure. Also, the active layer as light emitting layer 8 can have a quantum well structure including a thin layers for quantum effect.

(Nitride Semiconductor Layers)

The nitride semiconductors are formed of general formula $In_xAl_yGa_{1-x-y}N$ (0≤x, 0≤y, x+y≤1), and can be mixed with B, P, or As. The n-type semiconductor layer 6 and the p-type semiconductor layer 7 are not specifically limited to a single layer or multilayer structure. In the semiconductor structure 11, the active layer as light emitting layer 8 is included. This active layer has a single quantum well (SQW) or multi-quantum well structure (MQW). The semiconductor structure 11 is now described in detail.

The n-type nitride semiconductor layer and the p-type nitride semiconductor layer are formed on or above the growth substrate with the active layer being interposed between the p-type and n-type layers. A primary layer such as buffer layer of nitride semiconductor is interposed between the growth substrate and the nitride semiconductor layer. The primary layer can be formed of a low-temperature growth thin layer GaN and a GaN layer, for example. For example, the n-type nitride semiconductor layer can be formed of an n-type contact layer of Si-doped GaN, and an n-type multilayer film of GaN/InGaN. The p-type nitride semiconductor layer can be formed of an Mg-doped p-type multilayer film of InGaN/AlGaN and a p-type contact layer of Mg-doped GaN.

For example, the light-emitting layer (active layer) 8 of the nitride semiconductor has a quantum well structure which includes well layers of $Al_aIn_bGa_{1-a-b}N$ (0≤a≤1, 0≤b≤1, a+b≤1) and barrier layers of $Al_cIn_dGa_{1-c-d}N$ (0≤c≤1, 0≤d≤1, c+d≤1). The nitride semiconductor used for the active layer can be non-doped, n-type-impurity doped, or p-type-impurity doped. It is preferable that non-doped or n-type-impurity doped nitride semiconductor is used for the active layer. The reason is that non-doped or n-type-impurity doped nitride semiconductor can increase the output of the light emitting device. The barrier layer is formed of a nitride semiconductor having a larger band gap energy than the well layer. In the case where the well layer contains Al, it is possible to emit light with wavelength shorter than 365 nm corresponding to the band gap energy of GaN. The wavelength of the light emitted from the active layer can be designed about 360 to 650 nm depending on the application of the light emitting device, preferably 380 to 560 nm.

The well layer can be suitably formed of composition InGaN, which is suitable for visible or near-ultraviolet light emission. In this case, the barrier layer can be suitably formed of composition GaN or InGaN. The well layer preferably has a thickness not less than 1 nm and not more than 30 nm, more preferably not less than 2 nm and not more than 20 nm.

A mask with a predetermined shape is formed on the surface of the p-type semiconductor layer 7. The p-type semiconductor layer 7 and the active layer as light-emitting layer 8 are partially removed by etching. Thus, a predetermined part of the n-type contact layer is exposed which composes the n-type semiconductor layer 6.

(Light Reflection Structure)

The basic structure of the light emitting device according to the present invention is now described. Specifically, one of the two main surfaces of the semiconductor structure opposed to each other is the light outgoing side, and another is the light reflection side. The light reflection structure is arranged on the light reflection side, in particular, in an area where a light emitting structure such as the active layer is arranged.

The light reflection structure is formed as a part of electrode structure, a superposition structure in which the light reflection structure is sandwiched between electrode structures (e.g., the transparent electrically-conducting layer 13 and a later-discussed metal electrode layer 23), a coplanar separation structure in which the light reflection structure is separated from an electrode structure in the same surface, or a combination structure which combines them with each other. Preferably, the light reflection structure is formed as the superposition structure so as to increase the light emitting area corresponding to the light emitting structure, and improve electric charge injection efficiency. Specifically, the reflecting structure 20 is arranged between the transparent electrically-conducting layer 13 and the metal electrode layer 23 as the external connection (pad) electrode. The transparent electrically-conducting layer 13 is formed as the electrode arranged on the semiconductor layer contact side. The external connection (pad) electrode will be connected to a source arranged external of the device. The reflecting structure 20 between the electrodes (the transparent electrically-conducting layer (transparent electrode) and pad electrode) has a shape which allows the electrodes to be electrically conductive to each other (for example, a shape having openings). Specifically, it is preferable that electrically-conductive paths and reflective areas are separated in the same surface as discussed later. However, the reflecting structure is not limited to this. The reflecting structure may be formed as an electrically-conductive reflective structure. In the coplanar separation structure, electrically-conductive structures are formed in separation areas, the reflecting structure 20 can be formed of electrically-insulating materials. On the other hand, if the electrode is arranged on the light outgoing side, the electrode can be partial electrodes, a light-transmissible electrode, a transparent electrode, or a structure which combines them with each other.

The reflecting structure 20 in the present invention includes a reflective portion having reflectivity which varies depending on the wavelength of emitted light. Specifically, the reflecting structure includes a later-discussed dielectric multilayer film, DBR, or the like. In addition to the wavelength-dependent reflective portion, the reflecting structure can additionally include a transparent film and a metal reflective layer. The transparent film has a refractive-index difference from the semiconductor layer and the transparent member (the wavelength-dependent reflective portion or the electrode) so that light can be reflected by the refractive-index difference. In this case, the transparent film is arranged on the semiconductor layer side, while the light-impervious metal reflective layer is arranged outside the transparent film. The arrangement of the wavelength-dependent film and the transparent film is not specifically limited. However, in the case where the transparent film and the wavelength-dependent film are arranged from the semiconductor layer side in this order, it is possible to separately provide the reflection function of the transparent film by the refractive-index difference, and the wavelength-dependent and direction-dependent reflection function of the wavelength-dependent film. This case is preferable since both the functions can be improved.

In the light emitting device 10 shown in FIG. 2, the reflecting structures 20 formed under both the electrodes 3 (more preferably the optical characteristic of the reflecting structures 20) are substantially same. According to this construction, since the reflecting structures 20 under both the electrodes are substantially same, the color unevenness of the light emitting apparatus 1 as light source can be reduced. In addition to this, the manufacturing process can be simplified. Alternatively, the reflecting structures 20 formed under the electrodes 3A and 3B may have optical characteristic difference. For example, the thickness of the transparent film can be determined in consideration of the light incidence angle depending on location of electrode, the distance between the transparent film and the wavelength conversion member, which can be included in a covering layer, and the like.

Figure 3:
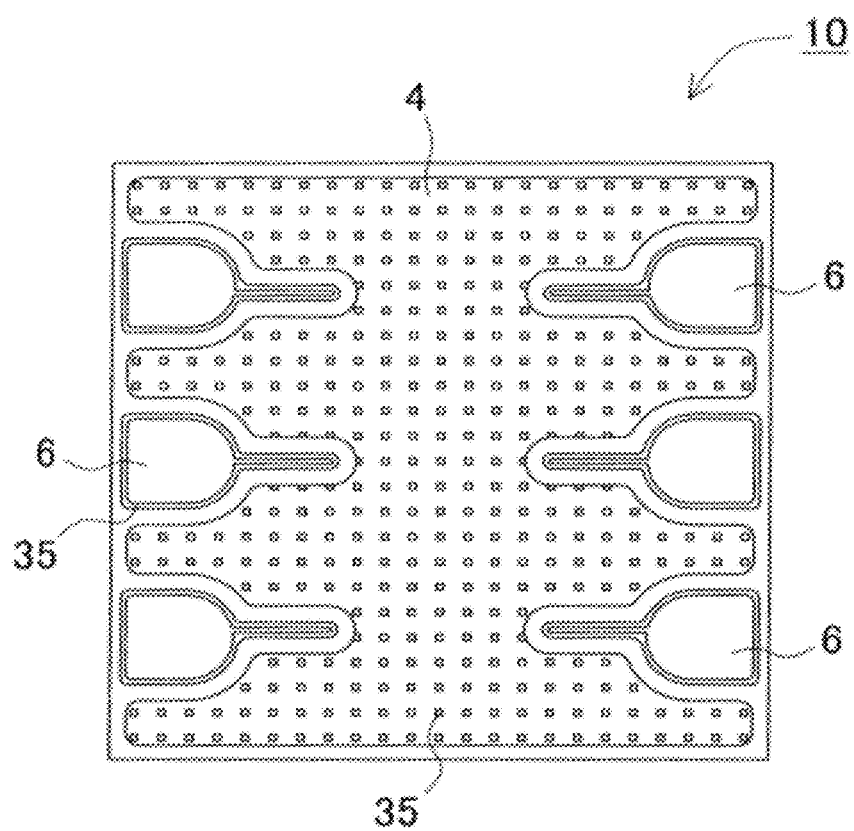
FIG. 3 is a plan view schematically showing an exemplary arrangement where a dielectric multilayer film is arranged in the upper surface of a transparent electrically-conducting layer.

It should be noted that the reflecting structure is not limited to a structure which includes only one film/member for each film/member type. The reflecting structure can be formed as a multiplex structure, for example, a superposition structure which includes a plurality of reflecting structures having respective types of films/members repeatedly arranged on one after another, or a structure which includes a plurality sets of respective types of films/members or multiplexed respective types of films/members. The following description will describe a reflecting structure which includes respective types of films/members formed integrally with each other. However, the reflecting structure is not limited to this. The respective types of films/members may have different shapes/patterns from each other. In a superposition reflecting structure, for example, a first reflecting structure group having dot-shaped openings as shown in FIG. 3 is arranged under a second reflecting structure group with the transparent electrically-conducting layers 13 such as ITO being interposed between the first and second reflecting structure groups. In this case, it is preferable that the second reflecting structure group at least partially overlaps the opening areas of the first reflecting structure group as viewed in cross-section. According to this construction, the formation area of reflecting structures increases as viewed in plan view from the electrode side. As a result, the reflective efficiency can be improved, and the light outgoing efficiency can be increased.

Although the reflecting structure has been described which is arranged corresponding to the light emitting structure, the reflecting structure is not limited to this. The reflecting structure can be arranged in a non-light emission area such as n-electrode area, the side surfaces of the semiconductor layers or the side surfaces of the light emitting structure, or device surfaces. For example, the reflecting structure can be arranged overlapping the protective film. The following description will describe the transparent electrically-conducting layer 13, the reflecting structure 20, the electrode 3, and the protective film.

(Transparent Electrically-Conducting Layer 13)

The transparent electrically-conducting layer 13 is mainly formed on or above the p-type semiconductor layer 7. For example, in the case where the electrically-conducting layer is formed almost all over the p-type semiconductor layer 7 and the exposed n-type semiconductor layer 6, a current can uniformly spread all over the p-type semiconductor layer 7. In addition, since the electrically-conducting layer is transparent, the reflecting structure can be additionally arranged on the electrically-conducting layer. The covering area of the transparent electrically-conducting layer 13 may be one of the n-type semiconductor layer 6 and the p-type semiconductor layer 7.

Although many sorts of transparent electrodes are known, the transparent electrically-conducting layer 13 preferably is formed of an oxide containing at least one element selected from the group consisting of Zn, In and Sn. Specifically, it is preferable that the transparent electrically-conducting layer 13 is formed of an oxide containing Zn, In or Sn such as ITO, ZnO, $In_2O_3$, $SnO_2$. In particular, the transparent electrically-conducting layer 13 is more preferably formed of ITO. In this case, the transparent electrically-conducting layer can be in good ohmic contact with the member to be contacted. Alternatively, the transparent electrically-conducting layer may be a metal thin film of Ni or the like with thickness 3 nm. Also, the transparent electrically-conducting layer may be a thin film of oxide or nitride of other metal, or compound of them. Also, the transparent electrically-conducting layer may be a light-transmissible structure such as a metal film having openings as windows. Also, the transparent electrically-conducting layer may be a combination structure which combines these features with each other. Thus, the electrically-conducting layer is formed almost all over the electrically-conductive semiconductor layer, for example, the p-type semiconductor layer, so that a current can uniformly spread all over the layer.

The thickness of the transparent electrically-conducting layer 13 can be determined in consideration of the light absorption and electrical/sheet resistance of the semiconductor layer, in other words, the light reflective structure and current spread of the semiconductor layer. For example, the thickness of the transparent electrically-conducting layer 13 can be not more than 1 μm, specifically, 10 to 500 nm. In addition, it is preferable that the thickness of the transparent electrically-conducting layer is an integral multiple of $\lambda/4$ ($\lambda$ is the wavelength of light emitted from the active layer 8). In this case, the light outgoing efficiency can be increased.

(Reflecting Structure 20)

As shown in FIG. 2, the reflecting structure 20 is formed on or above the transparent electrically-conducting layer 13 in at least part of the area interposed between the semiconductor structure 11 and the electrode 3. The reflecting structure is preferably formed in a predetermined pattern so as to cover substantially the entire of the semiconductor structure and the transparent electrically-conducting layer 13. In addition, as shown in FIG. 2, the transparent electrically-insulating film 16 can be interposed as the transparent film between the transparent electrically-conducting layer 13 and the metal electrode layer 23. In this case, it is preferable that the electrically-insulating film 16 is at least partially opened, and the transparent electrically-conducting layer 13 is exposed in the partially-opened areas. Also, the electrically-insulating film 16 can be arranged in the reflecting structure 20 and serve as the reflective layer 16.

The electrically-insulating film 16 serves to efficiently reflect light from the light emitting device 10. Therefore, the electrically-insulating film 16 is preferably formed of an oxide containing at least one element selected from the group consisting of Si and Al. Specifically, the electrically-insulating film can be formed of $SiO_2$, $Al_2O_3$, or the like. The electrically-insulating film can be more preferably formed of $SiO_2$. Also, it is preferable that the thickness of the electrically-insulating film 16 is not less than 200 nm, for example, about 100 nm to 2 μm. In particular, in the case where a metal electrode layer is formed in the upper surface of the electrically-insulating film 16, or in the case where the electrically-insulating film is formed as the reflecting structure 20, it is preferable that the thickness of the electrically-insulating film 16 falls within the range of 10 to 500 nm.

In the example of FIG. 2, the reflecting structure 20 includes the reflective layer 16 of electrically-insulating film, and the dielectric multilayer film 4 which is additionally formed on or above the reflective layer 16. The reflective layer 16 extends under the dielectric multilayer film 4 as viewed in plan view.

(Dielectric Multilayer Film 4)

The dielectric multilayer film 4 is formed as a multilayer structure where two or more types of dielectric layers with different refractive indices are alternately formed on each other. Specifically, alternately formed on each other are the different-refractive-index dielectric layers having thickness of ¼ of the wavelength of light so that the light with the predetermined wavelength can be efficiently reflected. The dielectric multilayer film 4 is preferably formed of a material of at least one oxide or nitride containing an element selected from the group consisting of Si, Ti, Zr, Nb, Ta and Al. In particular, the dielectric multilayer film 4 more preferably includes at least two oxides/nitrides containing an element selected from the group consisting of Si, Ti, Zr, Nb, Ta and Al with the at least two oxides/nitrides being repeatedly arranged on each other. The dielectric multilayer film 4 is preferably formed as a laminated structure which is formed of nonmetallic materials or oxides, for example, is formed of $(SiO_2/TiO_2)_n$ (n is a natural number). Also, in the two types of dielectric layers with different refractive indices, the lower-refractive-index dielectric layer can be formed of $SiO_2$, while the higher-refractive-index dielectric layer can be formed of $Nb_2O_5$, $TiO_2$, $ZrO_2$, $Ta_2O_5$, or the like. According to this construction, as compared with metal materials, the loss by light absorption of the reflective layer 16 can be reduced.

Also, the dielectric multilayer film 4 preferably consists of two to five pairs of, more preferably three to four pairs of, different-refractive-index dielectric layers with the pairs of different-refractive-index dielectric layers being arranged on each other. In addition, it is preferable that the total thickness of the dielectric multilayer film 4 is 0.2 to 1 μm, more preferably, 0.3 to 0.6 μm. According to this construction, it is possible to suppress that the dielectric multilayer interferential action causes sharp drop in light transmittance. Accordingly, it is possible to provide high reflectivity continuously in wide wavelength range. As a result, even if the center wavelength of reflecting structure is longer than the light emission peak wavelength of a light source, it is possible to suppress reduction of the reflectivity of perpendicularly-incident light. That is, it is possible to reflect not only light from the light source incident on the reflecting structure 20 at a certain incidence angle but also light incident on the reflecting structure at a small incidence angle. Therefore, it is possible to relatively increase the light output of light emitting device.

(Reflective Layer 16)

The reflective layer 16 is formed under the bottom surface of the dielectric multilayer film 4. The refractive index of the reflective layer 16 is lower than the refractive index of the semiconductor structure 11. According to this construction, when light is incident from the light-emitting layer 8 on the reflective layer 16, the light can be efficiently reflected toward the light outgoing side. Specifically, it is preferable that the refractive index falls within the range of 1.45 to 1.68. In this range, it is possible to effectively reflect the light incident from the semiconductor structure 11 on the reflective layer 16 at a certain angle.

The reflective layer 16 in the nitride semiconductor device 10 shown in FIG. 2 is formed of $SiO_2$. According to this construction, more than 80% of emitted light can be reflected which is incident from the light-emitting layer 8 on the reflective layer 16 at angles not lower than 37° where the angle of perpendicular-incident light from the light-emitting layer 8 on the reflective layer 16 is defined 0°. In addition, the reflective layer 16 can also serve as the electrically-insulating film 16. The reflective layer is preferable since the reflective layer can have both electrically insulating function and light reflective function. In addition, the dielectric multilayer 4 and additionally the later-discussed metal reflective layer can reflect light which is incident at angles not greater lower than 37°. Specifically, the thickness of the dielectric multilayer 4 is adjusted which is formed on or above the reflective layer 16 in the reflecting structure 20. The center wavelength of the reflection spectrum is adjusted to 1.05 to 1.35 times the light emitting peak wavelength of the light-emitting layer. According to this construction, the light can be efficiently reflected which passes the reflective layer 16. As a result, the total reflectivity by the reflecting structure 20 can be substantially 100%.

Figure 5:
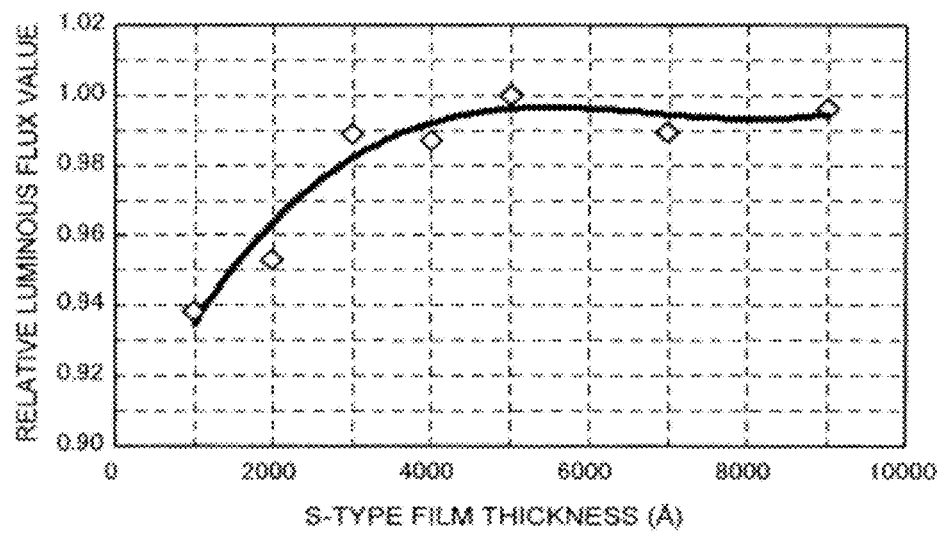
FIG. 5 is a graph showing relationship between the thickness of a reflective layer and the relative luminous flux value.

The reflectivity of the reflective layer 16 of $SiO_2$ can be increased by increasing its thickness. FIG. 5 shows the luminous flux relative value variation with the thickness of the reflective layer 16 of $SiO_2$. As illustrated, the luminous flux relative value is gradually increased until the thickness reaches 5000 Å, and reaches substantially a saturation value at the 5000 Å. It can be said that this shows that stable luminous flux can be provided in the case where the thickness of the reflective film is not less than 5000 Å.

(Electrode)

After the reflecting structure 20 containing the dielectric multilayer film 4 is formed on or above the transparent electrically-conducting layer 13, as shown in FIG. 2, the metal electrode layer 23 is formed, and is electrically connected to the transparent electrically-conducting layer 13. The metal electrode layer 23 is in contact with the transparent electrically-conducting layer 13 and the dielectric multilayer film 4. Again, the transparent electrically-conducting layers 13 are suitably arranged on the p-type semiconductor layer 7 side and on n-type semiconductor layer 6 side. The dielectric multilayer film 4 composes the reflecting structure 20. The metal electrode layers 23 are formed on the first electrode 3A side and the second electrode 3B side.

The metal electrode layer 23 is arranged at least partially in the surface of the multilayer film 4, and serves as a metallic reflective layer having an optical characteristic which efficiently reflects light traveling toward the metallic reflective layer. It is preferable that the metal electrode layer 23 is arranged substantially in the entire of the reflecting structure surface. In addition, the metal electrode layers also serve as pad electrodes which electrically connect the light emitting device to exterior terminals. For example, electrically-conducting members such as Au bumps are formed on the metal electrode layer surfaces so that the electrodes of the light emitting device are electrically connected through the electrically-conducting members to the exterior terminals, which are opposed the electrodes of the light emitting device. Parts of the metal electrode layer are directly electrically connected to the transparent electrically-conducting layer 13. Suitable existing structures can be used as the pad electrode. For example, the pad electrode can be formed of any metal or any alloy of Al, Cu, Au, Pt, Pd, Rh, Ni, W, Mo, Cr and Ti, or combination of them. An example of the metal electrode layer can be provided by a laminated structure constructed of W/Pt/Au, Rh/Pt/Au, W/Pt/Au/Ni, Pt/Au, or Ti/Rh. Each of the elements are formed on other element in this order from the lower surface side in W/Pt/Au, Rh/Pt/Au, W/Pt/Au/Ni, Pt/Au, or Ti/Rh.

In the first embodiment 1, the metal electrode layer 23 is formed in at least partial contact with the reflecting structure 20 and the transparent electrically-conducting layer 13. In a modified embodiment, the metal electrode layer 23 may have contact portions as parts of the metal electrode layer 23 which extend in through holes formed the transparent electrically-conducting layer 13. Alternatively, the metal electrode layer 23 may have contact portions which are arranged outside the transparent electrically-conducting layer 13 and are in direct contact with the nitride semiconductor layer. In these cases, the contact portions as parts of the metal electrode layer can increase bonding strength of the metal electrode layer.

It is preferable that the metal electrode layers 23 are formed of the same metals with the same thickness when being formed on the p-type nitride semiconductor layer 7 side and the n-type nitride semiconductor layer 6 side. The reason is that both the metal electrode layers can be simultaneously formed. In this case, it is possible to simplify the formation process of the metal electrode layers as compared with the case where the metal electrode layers are formed in separate formation processes. In the case where the metal electrode layers are formed in separate formation processes, the electrode on the n-type nitride semiconductor layer side can be constructed as W/Pt/Au electrode (e.g., thicknesses 20/200/500 nm), W/Pt/Au/Ni electrode with Ni additionally formed on W/Pt/Au electrode, Ti/Rh/Pt/Au electrode, or the like. In the embodiment shown in FIG. 2, the metal electrode layer 23 is constructed of Ti/Rh, which has high reflectivity and weatherability.

(Protective Film)

After the metal electrode layer 23 is formed, the electrically-insulating protective film can be formed substantially in the entire surface of the semiconductor light emitting device 10 except the connection areas to be connected to the external terminals. That is, openings are formed in the protective film which covers the n-type electrode 3A portion and the p-type electrode 3B portion. The protective film can be formed of $SiO_2$, $TiO_2$, $Al_2O_3$, polyimide, or the like.

The light emitting device according to the aforementioned embodiment has been described which has the mount surface with the p and n electrodes, and a back surface as the light-outgoing surface. However, the light emitting device according to the present invention is not limited to this. The light emitting device according to the present invention can has the light-outgoing surface with p and n electrodes, and the back surface as the mount surface. In this case, the substrate side is mounted, while the p and n electrodes are wired by wirebonding or the like. Although these exemplary light emitting devices has the p and n electrodes are arranged on the same surface, the light emitting device according to the present invention is not limited to this construction. The present invention can be applied to a light emitting device having a pair of electrodes which are arranged above and under the light-emitting layer with the light-emitting layer being interposed between the pair of electrodes (i.e., vertical type light emitting device). In the case of the vertical type light emitting device, the reflective layer 16 is arranged at least in the electrode on the wiring board side onto which the light emitting device is mounted. Thus, when light is incident on the reflective layer 16, the light can be reflected toward the light outgoing side opposed to the device-mount wiring substrate side. In the case where the reflecting structure 20 is additionally formed in the electrode which is formed on the light outgoing surface side, light absorption by the electrode can be suppressed. As a result, it is possible to external quantum efficiency.

(Light Emitting Apparatus)

The thus-constructed light emitting device is mounted onto the wiring board in a flip-chip mounting manner so that the light emitting apparatus is provided. An exemplary production method of the light emitting apparatus 1 shown in FIG. 1 is now described. The bumps are first formed on a wafer used as the submount substrate 9 in patterns for mounting the light emitting device 10 in a flip-chip mounting manner. Subsequently, the light emitting device 10 is mounted by the bumps in a flip-chip mounting manner. A metal mask is formed on the wafer by screen printing. Resin for forming the covering layer is applied on the metal mask, and is spread by a squeegee. After the resin is cured, the metal mask is removed. The wafer is cut by dicing, and is divided into submount boards with a submount board size. The cut submount substrate 9 is fixed onto a support member through an eutectic layer by eutectic die-bonding. The terminals of the submount board 9 are connected to terminals of the support member by wire-bonding. A lens formed of resin is fixed by an adhesive or the like so as to surround the periphery of the LED chip. Thus, the light emitting apparatus is provided.

Figure 4:
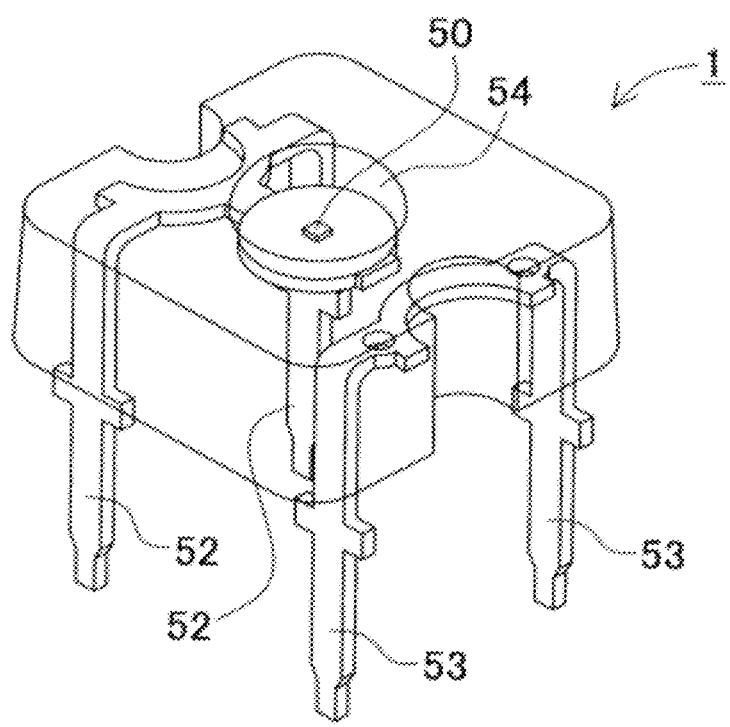
FIG. 4 is a perspective view showing a light emitting apparatus.

Leads 52 and 53 of the light emitting apparatus 1 are sealed by a transparent sealing member as shown in FIG. 4. A light emitting device 50 is arranged in a mount portion of one mount lead 52. A lens portion 54 as a sealing member is arranged in an upper part of the mount portion.

The material of the sealing member is not specifically limited as long as it is transparent. Although the sealing member is preferably formed of a silicone resin composition, a denatured silicone resin composition or the like, a transparent, electrically-insulating resin composition may be used such as epoxy resin composition, denatured epoxy resin composition and acrylic resin composition or the like. In addition, the sealing member can be formed of a high weather-resistant material such as hybrid resin containing at least one or more types of the resins. Also, a high light-resistant inorganic material may be used such as glass and silica gel. The light-outgoing side of the sealing member can be formed in a desired shape so that the sealing member has a lens effect.

(Additive Member)

The sealing member can contain suitable members (e.g., wavelength conversion member, viscosity adjusting agent, pigment, and phosphor) depending on the applications. According to this construction, it is possible to the light emitting apparatus with excellent directivity. Similarly, various types of coloring agents can be added as a filter material which provides a filter effect for cutting off external entering light and light with unnecessary wavelength from the light emitting device. Also, the sealing member can contain a filler in addition to a phosphor. Specifically, materials similar to the diffusion materials can be used as a material of the filler. However, the filler has a center particle size different from the diffusion agent. The filler preferably has a center particle size of not less than 5 μm to not more than 100 μm. In the case where the sealing member contains the filler with such a center particle size, chromaticity unevenness of the light emitting apparatus can be improved by light dispersion, and additionally thermal shock resistance of the sealing member can be improved.

Although the light emitting peak wavelength of emitted light is not specifically limited which is emitted from the light-emitting layer of the light emitting device in the light emitting apparatus, the semiconductor light emitting device can have a light emission spectrum in the near-ultraviolet range to the short wavelength visible light range (about 240 to 650 nm), for example. The semiconductor light emitting device preferably has a light emission spectrum in the range of 360 to 420 nm, or 450 to 650 nm.

(Intermediate Layer 17)

Figure 8A:
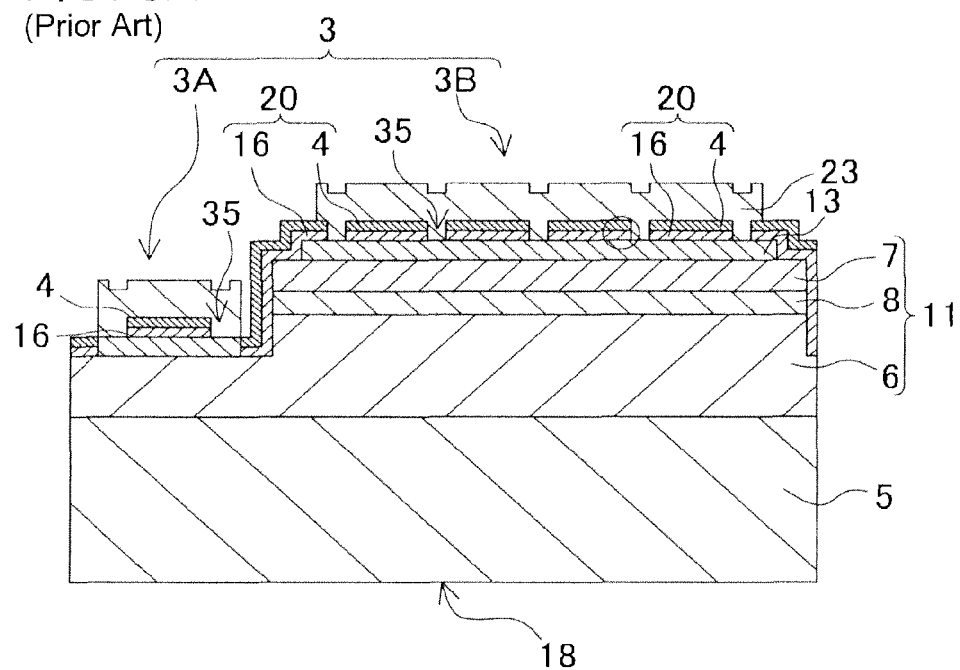
FIG. 8A is a cross-sectional view showing a known semiconductor light emitting device.
Figure 8B:
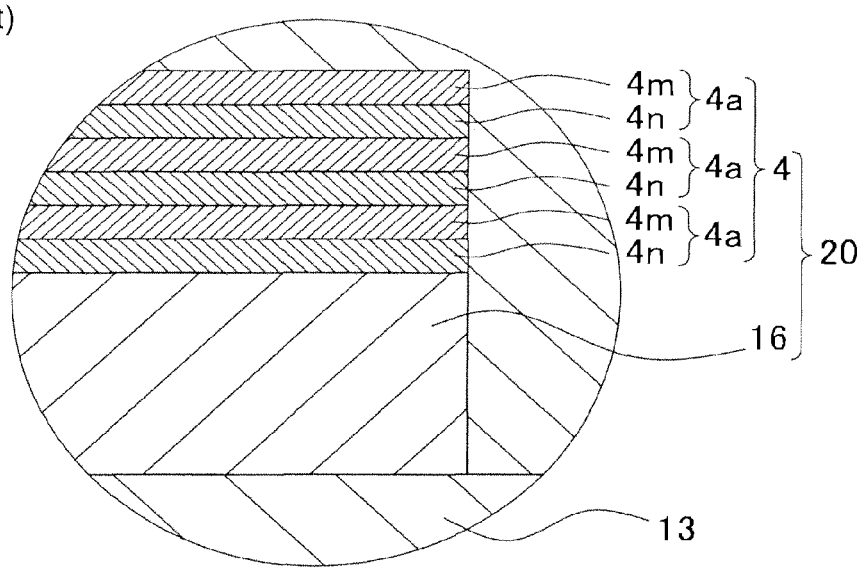
FIG. 8B is a partial enlarged view of the light emitting device shown in FIG. 8A.

In the case of a semiconductor light emitting device shown in FIG. 8A, when the transparent electrically-conducting layer 13 is formed of ITO, and a reflection multilayer extension portion is formed of $SiO_2$ which is the reflective layer 16 of the bottom layer of a reflection multilayer film, due to chemical reaction of ITO with $SiO_2$, the electrical resistance of the transparent electrically-conducting layer increases with the total operating time. For this reason, there is a problem that the operating voltage Vf (i.e., forward voltage) of the semiconductor light emitting device will increase. This increase of forward voltage Vf will shorten the span of time until it is determined that the device cannot properly operate any more, in other words, that the life of the device expires. In addition, since the bonding strength of the contact interface between ITO and $SiO_2$ is weak, the transparent electrically-conducting layer may peel off the reflection multilayer film, which in turn will cause device failure. For this reason, there is a problem that the life of the device may also be short.

Figure 2A:
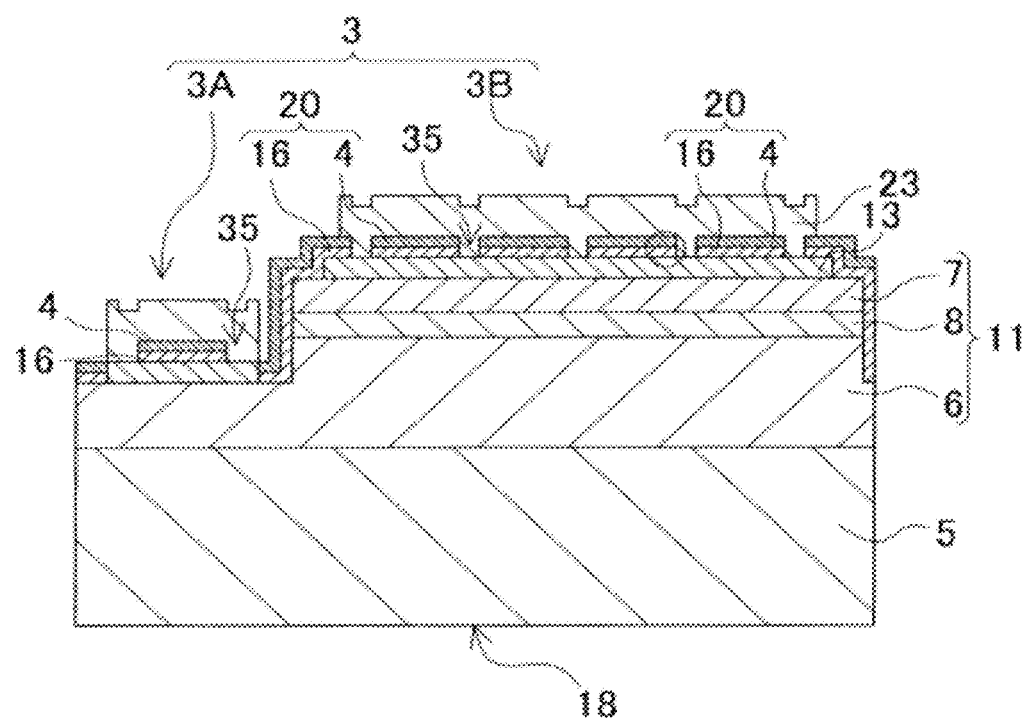
FIG. 2A is a cross-sectional view showing a light emitting device according to the first embodiment.
Figure 2B:
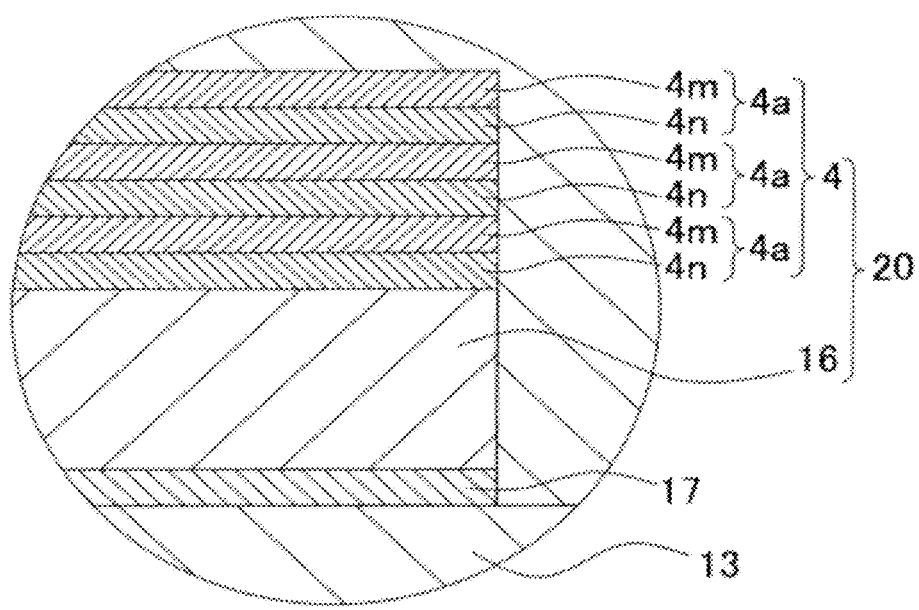
FIG. 2B is an enlarged cross-sectional view of the light emitting device shown in FIG. 2A.

In order to suppress such electric/mechanical deterioration of the device and to increase the life of device, according to this embodiment, an intermediate layer 17 is interposed between the transparent electrically-conducting layer 13 and the reflecting structure 20, as shown in FIG. 2A. That is, it is conceivable that the transparent electrically-conducting layer 13 is oxidized by chemical reaction with the reflecting structure 20 of the electrode. Accordingly, a material containing an element with larger ionization tendency is arranged in the upper surface of the transparent electrically-conducting layer 13 so that such oxidation reaction is suppressed. Thus, the rise of the resistance (i.e., Vf) can be suppressed. The intermediate layer is interposed between the transparent electrically-conducting layer and the reflecting structure, and can serve as a voltage-rise preventing layer which prevents the rise of the forward voltage.

The intermediate layer 17 can be formed of $Nb_2O_5$, $Al_2O_3$ or $TiO_2$ as a material which contains an element with larger ionization tendency than the reflective layer 16. Also, the intermediate layer 17 can be formed of SiN as a material which does not substantially contain oxygen in the composition of the material, or the like. In particular, in the case where the intermediate layer 17 is formed of the same material as any of the layers in the dielectric multilayer film 4 which composes the reflecting structure 20, any additional target material is not required when the intermediate layer 17 is deposited. Therefore, it is possible to improve the efficiency of the manufacture processes and to keep the cost in check. From this viewpoint, the intermediate layer 17 is preferably formed of $Nb_2O_5$.

The intermediate layer 17 preferably has a thickness in the range of 270 to 540 Å. If the thickness of the intermediate layer is smaller than this range, the life characteristic of the device will decrease. If the thickness of the intermediate layer is greater than this range, the output of the device will decrease.

(Durability Test)

A durability test is conducted to confirm whether the rise of Vf is suppressed when the intermediate layer 17 is additionally formed. Specifically, a semiconductor light emitting device according to an example 1 is formed which includes the intermediate layer 17 with 540 Å formed of $Nb_2O_5$, while a known semiconductor light emitting device according to a comparative example 1 is formed which does not the intermediate layer. The semiconductor light emitting devices continuously operate for 1000 hours with the temperatures of the light-emitting layer being held at 152° and 172° C. under a continuously-operating test. The rise rate of operating voltage is measured from the start of operation at driving current 350 mA (rated current). Specifically, in the example 1, the intermediate layer 17 is formed of $Nb_2O_5$. The transparent electrically-conducting layer 13 is formed of ITO and has a thickness 800 Å. The reflecting structure 20 is formed which includes an $SiO_2$ layer with thickness 5000 Å, and three pairs of $Nb_2O_5/SiO_2$ as the dielectric multilayer film 4. The pairs of $Nb_2O_5/SiO_2$ are formed on each other. The eutectic electrode is formed of Pt/Au. The semiconductor light emitting device according to the comparative example is formed under the same conditions except that the $Nb_2O_5$ is not included. In the comparative example 1, the rises of operating voltage are 2.6% and 3.7% at temperatures of the light-emitting layer 152° and 172° C., respectively. According to the result, the rise of operating voltage gets larger with the temperature of the light-emitting layer. In the example 1, the rises of operating voltage are 1.3% and 1.5% at temperatures of the light-emitting layer 152° and 172° C., respectively. The rise of operating voltage almost does not vary with the temperature of the light-emitting layer. The suppression of Vf rise can be confirmed.

(Sharing Test)

Figure 6:
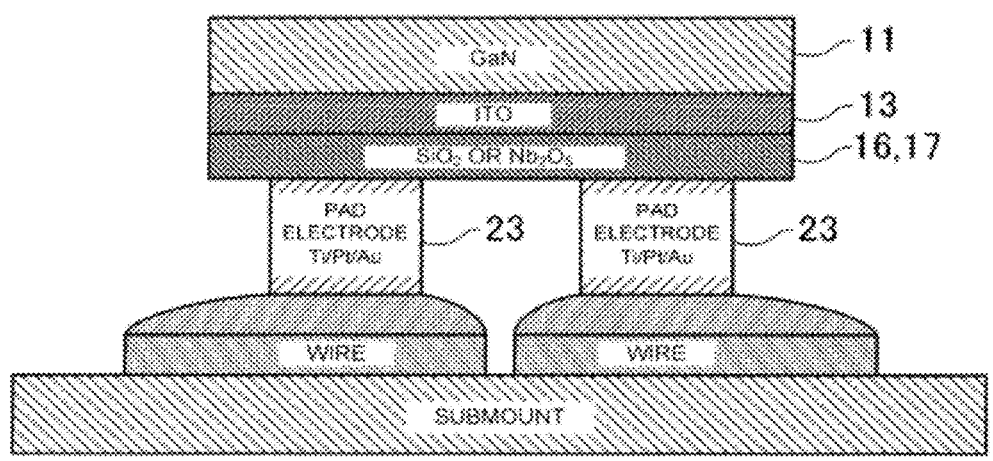
FIG. 6 is a cross-sectional view showing the structure of a sample used in a shearing experiment.
Figure 7:
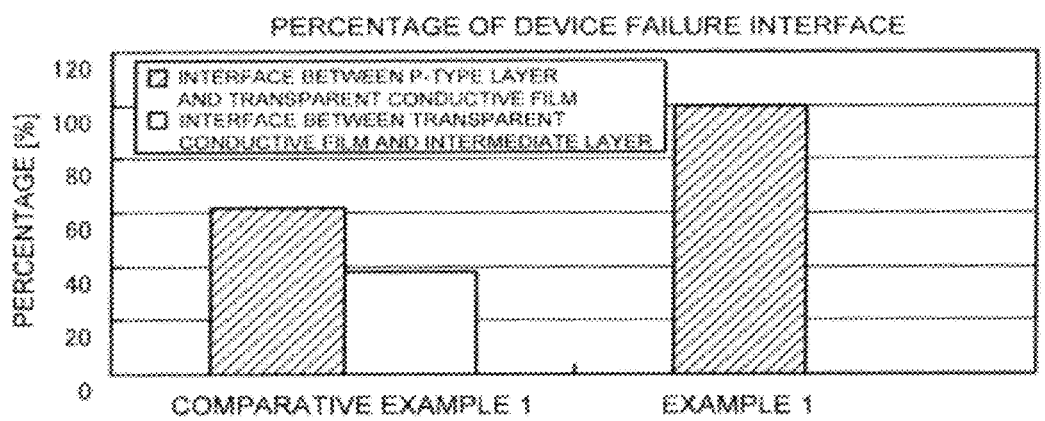
FIG. 7 is a graph showing the results of the shearing experiment according to an example 1 and a comparative example 1.

In order to confirm the effect of the additionally-formed intermediate layer 17 on the strength improvement of the contact interface between the transparent electrically-conducting layer 13 and the electrode structure, samples of the semiconductor light emitting devices according to the example 1 and the comparative example 1 are formed as shown in FIG. 6, and a sharing test is conducted. FIG. 7 is a graph showing the result. In the comparative example 1, peering occurs both in the interfaces between the p-type semiconductor layer and the transparent electrically-conducting layer 13, and the transparent electrically-conducting layer 13 and the reflective layer 16. In particular, in the comparative example 1, peeling is found both in the peeling interface of GaN/ITO, and the peeling interface between ITO and $SiO_2$. In the example 1, as shown in FIG. 7, peeling occurs only in the interface between the p-type semiconductor layer and the transparent electrically-conducting layer 13. According to the result, it can be conformed that, when the intermediate layer 17 of $Nb_2O_5$ is additionally formed, peeling is prevented in the interface between ITO as the transparent electrically-conducting layer 13 and $Nb_2O_5$, in other words, the bonding strength in the bonding surface between ITO and $Nb_2O_5$ is stronger than the bonding interface between ITO and $SiO_2$.

INDUSTRIAL APPLICABILITY

A light emitting device according to the present invention can be applied to a lighting light source, an LED display, a back light source, a signal light, an illuminated switch, various types of sensors and indicators, and the like.

It should be apparent to those with an ordinary skill in the art that while various preferred embodiments of the invention have been shown and described, it is contemplated that the invention is not limited to the particular embodiments disclosed, which are deemed to be merely illustrative of the inventive concepts and should not be interpreted as limiting the scope of the invention, and which are suitable for all modifications and changes falling within the scope of the invention as defined in the appended claims.

The present application is based on Applications No. 2011-086,821 filed in Japan on Apr. 8, 2011, and No. 2012-25,525 filed in Japan on Feb. 8, 2012, the contents of which are incorporated herein by references.

What is claimed is:

1. A semiconductor light emitting device comprising:
a first semiconductor layer;
a second semiconductor layer that has a conductivity different from said first semiconductor layer;
an active region that is arranged between said first and second semiconductor layers;
a transparent electrically-conducting layer that is arranged on or above said first semiconductor layer;
an intermediate layer formed of $Nb_2O_5$ disposed in direct contact with the transparent electrically-conducting layer;
a reflecting structure that is arranged on or above said intermediate layer; and
a first electrode that is arranged on or above said reflecting structure, and is electrically connected to said first semiconductor layer,
wherein a bottom layer of said reflecting structure is a reflective layer formed of $SiO_2$, said bottom layer of said reflecting structure being disposed in direct contact with said intermediate layer.

2. The semiconductor light emitting device according to claim 1, wherein said transparent electrically-conducting layer is formed of an oxide containing at least one element selected from the group consisting of Zn, In, and Sn.

3. The semiconductor light emitting device according to claim 1, wherein said transparent electrically-conducting layer is formed of ITO.

4. The semiconductor light emitting device according to claim 1, wherein said intermediate layer has a thickness of 270 to 540 Å.

5. The semiconductor light emitting device according to claim 1, wherein said reflecting structure includes a dielectric multilayer film that is arranged on or above said reflective layer and is formed of a plurality of dielectric layers that include a first layer formed on or above said reflective layer and a second layer formed on or above the first layer, wherein the first layer of the dielectric layers forming the multilayer film is formed of $Nb_2O_5$.

6. The semiconductor light emitting device according to claim 5, wherein the second layer of the dielectric layers forming the multilayer film is formed of $SiO_2$.

7. The semiconductor light emitting device according to claim 1 further comprising a second electrode that is electrically connected to said second semiconductor layer, wherein:
said first and second electrodes are arranged on a first main surface side of the semiconductor light emitting device, and
said first main surface side serves as a mount surface side to be mounted, and a second main surface side opposed to said first main surface side serves as a light-outgoing surface side through which light exits.

8. The semiconductor light emitting device according to claim 1 further comprising a second electrode that is electrically connected to said second semiconductor layer, wherein:
said first and second electrodes are arranged on a first main surface side of the semiconductor light emitting device, and
said first main surface side serves as a light-outgoing surface side through which light exits, and a second main surface side opposed to said first main surface side serves as a mount surface side to be mounted.

9. The semiconductor light emitting device according to claim 1, wherein the thickness of said transparent electrically-conducting layer is approximately an integral multiple of $\lambda/4$, where $\lambda$ is the wavelength of light emitted from said active region.

10. The semiconductor light emitting device according to claim 5, wherein said dielectric multilayer film is formed as a multilayer structure including two or more types of dielectric layers with different refractive indices that are alternately formed on each other, wherein each of the dielectric layers has thickness of ¼ of the wavelength of light emitted from said active region.

11. The semiconductor light emitting device according to claim 1, wherein said reflecting structure has a superposition structure in which said reflecting structure is sandwiched between the transparent electrically-conducting layer and the first electrode, or a structure that provides electrically-conductive paths and reflective areas that are separated in the same surface.

12. The semiconductor light emitting device according to claim 1, wherein said reflecting structure includes a dielectric multilayer film that is arranged on or above said reflective layer and is formed of a plurality of dielectric layers, wherein a thickness of said dielectric multilayer film is smaller than a thickness of said reflective layer.

13. The semiconductor light emitting device according to claim 1, wherein a thickness of said reflective layer is at least 5000 Å.

* * * * *